(12) United States Patent
Varshney et al.

(10) Patent No.: US 7,249,307 B2
(45) Date of Patent: Jul. 24, 2007

(54) FLEXIBLE RATE AND PUNCTURED ZIGZAG CODES

(75) Inventors: Prabodh Varshney, Coppell, TX (US); Mohammad Jaber Borran, San Diego, CA (US)

(73) Assignee: Nokia Corporation, Espoo (FI)

( * ) Notice: Subject to any disclaimer, the term of this patent is extended or adjusted under 35 U.S.C. 154(b) by 457 days.

(21) Appl. No.: 10/971,681

(22) Filed: Oct. 21, 2004

(65) Prior Publication Data

US 2006/0107161 A1    May 18, 2006

(51) Int. Cl.
    H03M 13/00    (2006.01)
(52) U.S. Cl. ...................... 714/758; 714/801
(58) Field of Classification Search ............... 714/758, 714/801
    See application file for complete search history.

(56) References Cited

U.S. PATENT DOCUMENTS

| | | | | |
|---|---|---|---|---|
| 5,271,012 | A * | 12/1993 | Blaum et al. .................. | 714/6 |
| 5,847,840 | A * | 12/1998 | Enari .......................... | 358/409 |
| 6,023,783 | A * | 2/2000 | Divsalar et al. ............ | 714/792 |
| 6,408,029 | B1 * | 6/2002 | McVeigh et al. ...... | 375/240.13 |
| 7,085,986 | B2 * | 8/2006 | Nefedov ..................... | 714/755 |
| 2004/0123215 | A1 * | 6/2004 | Nefedov ..................... | 714/755 |
| 2006/0190801 | A1 * | 8/2006 | Shin et al. .................. | 714/758 |

FOREIGN PATENT DOCUMENTS

EP    1 441 448 A2    7/2004

OTHER PUBLICATIONS

Li Ping, Zigzag Codes and Concatenated Zigzag codes, Feb. 2, 2001, IEEE, vol. 47., No. 2.*

Berrou et al., "Near Shannon Limit Error—Correcting Coding and Decoding: Turbo-Codes (1)", 1993, IEEE, pp. 1064-1070.
Ping et al., "Iterative Decoding of Multi-Dimensional Concatenated Single Parity Check Codes", 1998, IEEE, pp. 131-135.
Chan et al., "Adaptive Type II Hybrid ARQ Scheme Using Zigzag Code", Nov. 25, 1999, Electronics Letters, vol. 35, No. 24, pp. 2102-2104.
Ping et al., "Zigzag Codes and Concatenated Zigzag Codes", Feb. 2001, IEEE Transactions on Information Theory, vol. 47, No. 2, pp. 800-807.
Wu, Xiaofu et al., "On Concatenated Zigzag Codes and Their Decoding Schemes", IEEE Communications Letters, vol. 8, No. 1, Jan. 2004, pp. 54-56.
Nefedov, Nikolai, "Evaluation of Low Complexity Concatenated Codes for High Data Rate Transmission", 14th IEEE 2003 International Symposium on Personal, Indoor and Mobile Radio Communication Proceedings, pp. 1868-1872.

* cited by examiner

*Primary Examiner*—Guy Lamarre
*Assistant Examiner*—Mujtaba K. Chaudry
(74) *Attorney, Agent, or Firm*—Harrington & Smith, PC

(57) ABSTRACT

A generalized zigzag code is described where the code segments (each including one parity bit and information bits) of a block are not necessarily of uniform length. For coding rates in which the average code segment length is not an integer, all code segment lengths may be identical. The number of code segments depends on the coding rate and number of information bits in a block. At the encoder, parity bits are added to each string of information bits in a block to yield the code segments. For a punctured code, concatenated or not, the encoder may remove or not generate the punctured parity bits. At a decoder that operates at a rate different from the code rate of a received block, null parity bits are inserted. The received block has a number of code segments. The decoder increases the number of code segments by the addition of null parity bits, thereby reducing the coding rate to the rate of the decoder. Methods and apparatuses are detailed.

23 Claims, 6 Drawing Sheets

FLEXIBLE RATE AND PUNCTURED ZIGZAG CODES

FIELD OF THE INVENTION

The present invention relates to encoding and decoding schemes for electronic communication systems, and to the relevant hardware/software to employ such coding schemes. The present invention is particularly related to zigzag codes and their implementation hardware/software.

BACKGROUND

Turbo codes, introduced in early 1990s, can achieve performance very close to the Shannon limit. These codes are now used in various cellular standards, e.g., WCDMA and 1×EV-DV. However, a turbo-decoder based on the a posteriori probability APP algorithm is highly complex. Concatenated single-parity check codes are an alternative that offer much reduced decoding complexity, but at the cost of high error floors and sub-optimal performance at low data rates.

It is believed that zigzag codes and concatenated zigzag codes were first introduced in a paper by L. Ping, X. Huang, and N. Phamdo, entitled ZIGZAG CODES AND CONCATENATED ZIGZAG CODES, *IEEE Transactions on Information Theory*, Vol. 47, No. 2, February 2001, pp. 800-807. The performance of zigzag codes has been asserted as very close to that of Turbo codes (only about 0.5 dB worse, according to the above paper), while the decoding complexity of zigzag codes is significantly lower than that of Turbo codes. By increasing the coding rate one can increase the data rate at the cost of degraded link performance and increased mega-instructions-per-second MIPS requirement (due to larger size of the data block to be decoded). For high data rate systems that use high coding rates, it is desirable to have lower complexity decoding schemes with performance as close to the Turbo codes (and thus the Shannon limit) as possible. Concatenated zigzag codes appear to provide an attractive alternative to Turbo codes in this respect.

Following is an abbreviated description of zigzag codes, as generally presented in the above paper by Li Ping et al. FIG. 1 is a prior art schematic view of information bits and parity bits in a zigzag code. The information bits to be encoded are represented by $\{d(i,j)\}$, $i=1,2,3, \ldots I$, $j=1,2,3, \ldots J$. The parity bits are represented by $\{p(i)\}$, $i=1,2, \ldots I$. Further, a segment is defined as $[p(i-1),d(i,1),d(i,2), \ldots d(i,J),p(i)]$, and is illustrated in FIG. 1 as the bits along one straight line. The parity bits are chosen such that each segment contains even numbers of ones. The code rate is thus $J/(J+1)$.

At the transmitter, the parity bits are computed as follows:

$$p(1) = \sum_{j=1}^{J} d(1,j) \bmod 2$$

$$p(i) = \left[\sum_{j=1}^{J} d(i,j) + p(i-1)\right] \bmod 2, \quad \text{for } i = 2, 3, \cdots, I.$$  [1]

Defining a weighting formula for parameters $a_1, a_2, \ldots a_n$ as $W(a_1, \cdots, a_n) = \left[\prod_{i=1}^{n} \text{sgn}(a_i)\right] \min_{1 \le i \le n} |a_i|,$ yields the following equations to calculate the MLA's of the parity and information bits, where $F[*]$ is the forward MLA for the bracketed parity bit, $B[*]$ is the backward MLA for the bracketed parity bit, and $L[*]$ is the MLA for the bracketed information bit:

$F[p(0)]=+\infty$ $F[p(i)]=\tilde{p}(i)+W(F[p(i-1)],\tilde{d}(i,1),\ldots,\tilde{d}(i,J))$, for $i=1, \ldots,I$  [2]

$B[p(I)]=\tilde{p}(I),$ $B[p(i)]=\tilde{p}(i)+W(\tilde{d}(i+1,1),\ldots,\tilde{d}(i+1,J),B[p(i+1)])$, for $i=I-1,\ldots,1$  [3]

$L[d(i,j)]=\tilde{d}(i,j)+W(F[p(i-1)],\tilde{d}(i,1),\ldots,\tilde{d}(i,j-1),\tilde{d}(i,j+1),\ldots,\tilde{d}(i,J),B[p(i)])$  [4]

The prior art zigzag code of FIG. 1 is shown in tabular form at FIGS. 2A-2B, with an additional set of parity codes to show how zigzag codes might be concatenated. FIG. 2A is an I*J size matrix of information bits $d(i,j)$, where I=5 and J=3. FIG. 2B is a column matrix of I rows showing parity bits $p(i)$. Redefining a code sequence as a string (of at least one) information bit $d(i,j)$ terminating with a parity bit $p(i)$, each of the code segments according to the paper by L. Ping et al. are then the rows of the matrix of FIG. 2A followed by the associated parity bit for the relevant value for i. Each code segment is necessarily the same length as all other code segments, which in this example is three information bits and one parity bit, because $j=1, 2, 3, \ldots J$ for each code segment.

A concatenated zigzag code is defined by (I,J,K) where K represents the number of encoders used in concatenation, each encoder multiplying the information bit matrix (FIG. 2A) by a separate parity bit matrix (FIG. 2B). The information data block of FIG. 2A (matrix of I rows and J columns, I*J) to be encoded is first passed through a random interleaver. The parity bits, $p(i)$, of this block of data are calculated using equation [1] above, and represented by FIG. 2B. The original information data block of FIG. 2A is now passed through a second random interleaver and a different set of parity bits are computed and interleaved. This concatenation continues for the number of encoders (K) used. Thus a total of K columns of parity bits (each having length I as shown in FIG. 2B) are computed and are transmitted along with the original information data block of FIG. 2A. The number of total transmitted bits is $I*(J+K)$ ($I*J$ is the number of the information bits and $I*K$ is the number of the parity bits). The code rate of a concatenated zigzag code is therefore $J/(J+K)$. Because each of J and K must be non-zero integers, the coding rate for the above described zigzag codes cannot be arbitrarily set in a transmitter with a finite number of encoders. Each code segment is still the same length as all other code segments.

Practical communication systems are usually required to support several different data rates depending on the channel conditions and user preferences. This requires flexible code rates and puncturing schemes along with appropriate decoding algorithms to provide the desired data rates at an acceptable error rate performance. In a paper by K. S. Chan, L. Ping and S. Chan, entitled ADAPTIVE TYPE II HYBRID ARQ Scheme Using Zigzag Codes, *Electronics Letters*, Vol. 35, No. 24, November 1999, pp. 2102-2104, a method of puncturing concatenated zigzag codes has been proposed which can be used in hybrid automatic repeat-request ARQ systems as well. However, it appears that the approach in the paper by K. S. Chan et al. does not enable an arbitrary rate code. The inventors view the set of available rates by that approach as not sufficiently broad to serve the needs of current telecommunications systems, as the only available rates are J/(J+1), J/(J+2), . . . , J/(J+K).

What is needed in the art is a coding scheme that enables high data rates but that is less computationally expensive than turbo codes. For practical deployment in existing communication infrastructure, such a coding rate should be compatible with various wireless standards already in use around the world.

SUMMARY OF THE INVENTION

In accordance with one aspect, the present invention is a method for encoding a stream of information bits. In the method, a coding rate x and a number of information bits B to be encoded in a packet are determined, where B is an integer and x is a real number. A number K of encoders are provided that are to be used for encoding, wherein K is a non-zero integer. A number of parity bits $$K*I = \frac{B}{x} - B$$

is determined, as is a number of code segments I. I is also an integer. Using that information, a set of values $J_i$, is selected, for all i=1, 2, . . . I, such that $$\sum_{i=1}^{I} J_i = B.$$

Of the set of $J_i$ values, at least one value for $J_i$ differs from at least one other value for $J_i$ within the set. That is to say, all $J_i$'s are not identical in value. Further in the method, code segments are built by adding a parity bit from each of the K encoders to each $i^{th}$ set of $J_i$ information bits for all i=1, 2, . . . I. For example, if $J_1$=8 and $J_2$=9, then a parity bit would be appended to the first group of 8 information bits, and a parity bit would be appended to the next group of 9 information bits. Further in the method, the I code segments, which each include information bits and at least one parity bit, are output sequentially.

In another aspect, the invention is also a method for encoding a stream of information bits. In this aspect, the method is similar to that recited immediately above, except that the coding rate may take on any value except $$\frac{J}{J+1}, \frac{J}{J+2}, \cdots \frac{J}{J+K},$$

where $$\overline{J} = \frac{B}{I}.$$

In this instance, the set of values for $J_i$ need not differ; each code segment may include the same number of information bits.

In another aspect, the present invention is a method for decoding a stream of information bits. In this aspect, the method includes determining a coding rate x, a number of information bits B to be decoded from a packet, and a number K of constituent encoders used in encoding, where B and K are integers and x is a real number. A number of parity bits K*I=

$$\frac{B}{x} - B$$

is determined, as is a number of code segments I. A set of values for $J_i$, is selected, where i=1,2, . . . I, such that $$\sum_{i=1}^{I} J_i = B.$$

Within the set of values for $J_i$, at least one value for $J_i$ differs from at least one other value for $J_i$ within the set. Further in the method and for all i=1,2, . . . I, all of the $J_i$ information bits and a parity bit of the $i^{th}$ code segment are checked for parity, and the parity bit that was used in the checking is removed.

In another aspect, the invention is also a method for decoding a stream of information bits. In this aspect, the method is similar to that recited immediately above, except that the coding rate may take on any value except $$\frac{\overline{J}}{\overline{J}+1}, \frac{\overline{J}}{\overline{J}+2}, \cdots \frac{\overline{J}}{\overline{J}+K},$$

where $$\overline{J} = \frac{B}{I}.$$

In this instance, the values for $J_i$ need not differ; each code segment may include the same number of information bits.

In another aspect, the present invention is another method for decoding a received block of data using a decoder of rate $x_{decode}$, where the received block of data has B information bits and $P_{encode}$ parity bits so that it is encoded at a rate $$x_{encode} = \frac{B}{B + P_{encode}}.$$

In this method, the rate of the decoder differs from the rate at which the block was encoded. In the method, a total number of parity bits $P_{decode}$ for decoding is determined, and $$P_{decode} = B\left(\frac{x_{encode}}{x_{decode}} - 1\right) + \frac{x_{encode}}{x_{decode}} P_{encode}.$$

Further in the method, a number $P_{diff} = P_{decode} - P_{encode}$ of null parity bits is added to the received block of data, and the received block of data with the added null parity bits is decoded in a rate $x_{decode}$ decoder. Preferably, a number $$\frac{P_{decode}}{P_{encode}} - 1$$

of null parity bits are added to each of $P_{encode}$ code segments of the received block. A null parity bit is one that does not affect any parity that may be done.

In another aspect, the present invention is a transmitter. The transmitter of this aspect has K constituent encoders, wherein K is a non-zero integer. Where K is one, the constituent encoder is the only encoder generating parity bits and no concatenation of the code takes place. The transmitter further has a memory for storing four items related to one another: a block size value B of information bits in a block, a coding rate x that is associated with the block size value B, a total number K*I of parity bits $$K * I = \frac{B}{x} - B$$

(this is not the parity bits themselves, but a count of how many parity bits), and a set of segment lengths $J_i$ such that $$\sum_{i=1}^{I} J_i = B \text{ for } i = 1, 2, \ldots I.$$

At least two of the segment lengths are not identical in length. The transmitter further has a processor that is coupled to the memory and to each of the constituent encoders. The processor causes the constituent encoder(s) to each insert a parity bit into each $i^{th}$ set of information bits, the $i^{th}$ set having $J_i$ information bits. The processor causes the encoder (each constituent encoder if K>1) to do so for all i=1, 2, 3 . . . I segments, so as to achieve the coding rate x for a block of B information bits. The transmitter further has a transmit antenna that has an input coupled to an output of the encoder.

In another aspect, the present invention is also a transmitter. In this aspect, the transmitter is similar to that recited immediately above, except that the coding rate stored in the memory may take on any value except $$\frac{J}{J+1}, \frac{J}{J+2}, \ldots \frac{J}{J+K},$$

where $$J = \frac{B}{I},$$

In this aspect, the segment lengths $J_i$ need not differ; each code segment may include the same number of information bits.

In another aspect, the present invention is a receiver. The receiver of this aspect has a receive antenna having an output for receiving a packet, and a decoder having an input coupled to the output of the receive antenna. Further, the receiver has a memory for storing several items, including: a block size value B of information bits in a block; a coding rate x associated with the block size value B; a value K of encoders used in encoding a block size value B with a coding rate x; a total number K*I of parity bits $$K * I = \frac{B}{x} - B;$$

and a set of segment lengths $J_i$ such that $$\sum_{i=1}^{I} J_i = B \text{ for } i = 1, 2, \ldots I.$$

In this aspect, each segment length $J_i$ is not identical to each other segment length. The receiver further has a processor that is coupled to the memory and to the decoder. The processor is for causing the decoder to remove a parity bit from each $i^{th}$ set $J_i$ received information bits. The processor causes the decoder to do so for all i=1, 2, 3 . . . I segments.

In another aspect, the invention is also a receiver. In this aspect, the receiver is similar to that recited immediately above, except that the coding rate stored in the memory may take on any value except $$\frac{J}{J+1}, \frac{J}{J+2}, \ldots \frac{J}{J+K},$$

where $$J = \frac{B}{I},$$

In this aspect, the segment lengths $J_i$ need not differ; each code segment may include the same number of information bits.

In another aspect, the present invention may be a computer program. In this aspect, it is a program of machine-readable instructions, tangibly embodied on an information bearing medium and executable by a digital data processor, to perform actions directed toward encoding a block of information bits. The actions include selecting a coding rate and an associated total number of information bits to be transmitted in a block, and determining a set of I string lengths $J_i$, where i=1, 2, ... I, that when added, equal the total number of information bits. That the program determines the set of string lengths does not imply that the set of string lengths is not also selected, such as where the set of string lengths (or a derivative thereof) are stored in a memory and associated with the coding rate and total number of information bits. For each $i^{th}$ string of $J_i$ information bits, the actions further include adding at least one parity bit to achieve an $i^{th}$ code segment. Where more than one encoder is used, each encoder (e.g., each constituent encoder) preferably adds one parity bit to each $i^{th}$ string of $J_i$ information bits. The code segments are serially sequenced to achieve the selected coding rate. At least one of the string lengths is not identical to at least one other string length, or, for the case that an average string length is an integer, the coding rate is other than the ratio of the average string length to the average string length plus an integer.

In another aspect, where the present invention is a computer program, it is a program of machine-readable instructions, tangibly embodied on an information bearing medium and executable by a digital data processor, to perform actions directed toward decoding a block of information bits. In this aspect, the actions include selecting a coding rate, an associated total number of information-bits in a received block of data, an associated total number of parity bits in the received block of data, and an associated set of I string lengths $J_i$, where i=1, 2, ... I. These may be selected from a memory. For each $i^{th}$ code segment having $J_i$ information bits, the actions include adding at least one null parity bit so as to reduce the coding rate of the received block of data.

In another aspect, the present invention is an encoder for encoding a block of information bits at a code rate by inserting one parity bit from an encoder into each $i^{th}$ group of information bits for I=1, 2, ... I. Where there are K encoders, K*I equals the code rate. In each $i^{th}$ group, there are $J_i$ information bits, and each information bit of the block is within only one group and not all groups define the same number of information bits. The number of groups of information bits depends from the coding rate and on the number of information bits in the block.

In another aspect, the present invention is an encoder similar to that immediately above, except that all groups may define the same number of information bits, but for the case where an average number of information bits in a group (averaged over all the groups) is an integer, the coding rate is a rate other than a ratio of the average number of information bits in a group to the average number of information bits in a group plus an integer.

In another aspect, the present invention is a decoder for decoding, at a second code rate, a received block of information and parity bits. The received block is received at a first code rate. The decoding is done by inserting a number of null parity bits into each $i^{th}$ group of information bits where i=1, 2, ... I. For each $i^{th}$ group, there are $J_i$ information bits and at least one parity bit, each bit of the received block is within only one group. The number of null parity bits that the decoder inserts reduces the first code rate to the second code rate.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention.

BRIEF DESCRIPTION OF THE DRAWINGS

The present invention is described below more particularly with reference to the following drawing figures, which are not to scale except where stipulated.

DETAILED DESCRIPTION

This invention provides an adaptation to the zigzag codes described above so that an arbitrary or flexible coding rate may be obtained. To provide further flexibility, this disclosure also details how puncturing may be applied to the adapted zigzag codes. Puncturing provides complete flexibility in the code rate without requiring any further change in the encoder and decoder hardware or software. The numerical results of the error rate performances of the proposed schemes are also presented in this report.

As mentioned in the background section, the rate of a concatenated zigzag code is determined by the J and K parameters of the code as J/(J+K), where J is the number of information bits in a code segment and K is the number of encoders in the concatenation. For a fixed number of encoders (i.e., for a fixed K), the only free parameter to adjust the code rate is J, and one can generate different code rates by using different values for this parameter (e.g., with K=4, setting J=4 results in a code rate of 1/2, whereas setting J=20 results in a code rate of 5/6). However, since J can take only integer values, the set of code rates that can be generated by this prior art approach is very limited. This limitation comes from the requirement that all of the segments of the prior art code have the same number of information bits. As presented in the above noted paper by L. Ping et al., this limitation appears inherent to their zigzag codes.

The inventors have developed a modification to zigzag codes so that the requirement that all code segments have the same number of information bits is no longer fundamental, and the parity bits in different segments of the code can be generated for different numbers of information bits. In that respect, the present invention is essentially generalized zigzag codes with non-uniform size of code segments. This is shown schematically at FIG. 3, which is similar to FIG. 1 but for zigzag codes according to the present invention. Comparing the two diagrams, it is clear that the prior art zigzag codes of FIG. 1 represent a special case of the generalized zigzag codes of FIG. 3.

Figures 1, 2A, 2B:
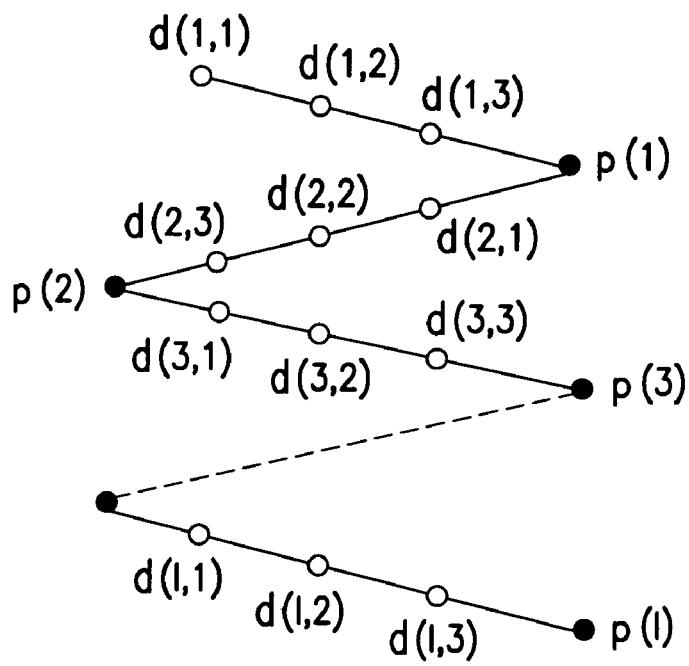
FIG. 1 is a prior art schematic view of information bits and parity bits in a prior art zigzag code.
FIG. 2A is a prior art matrix of information bits of FIG. 1.
FIG. 2B is a prior art matrix of parity bits of FIG. 1.
Figures 3, 4A, 4B:
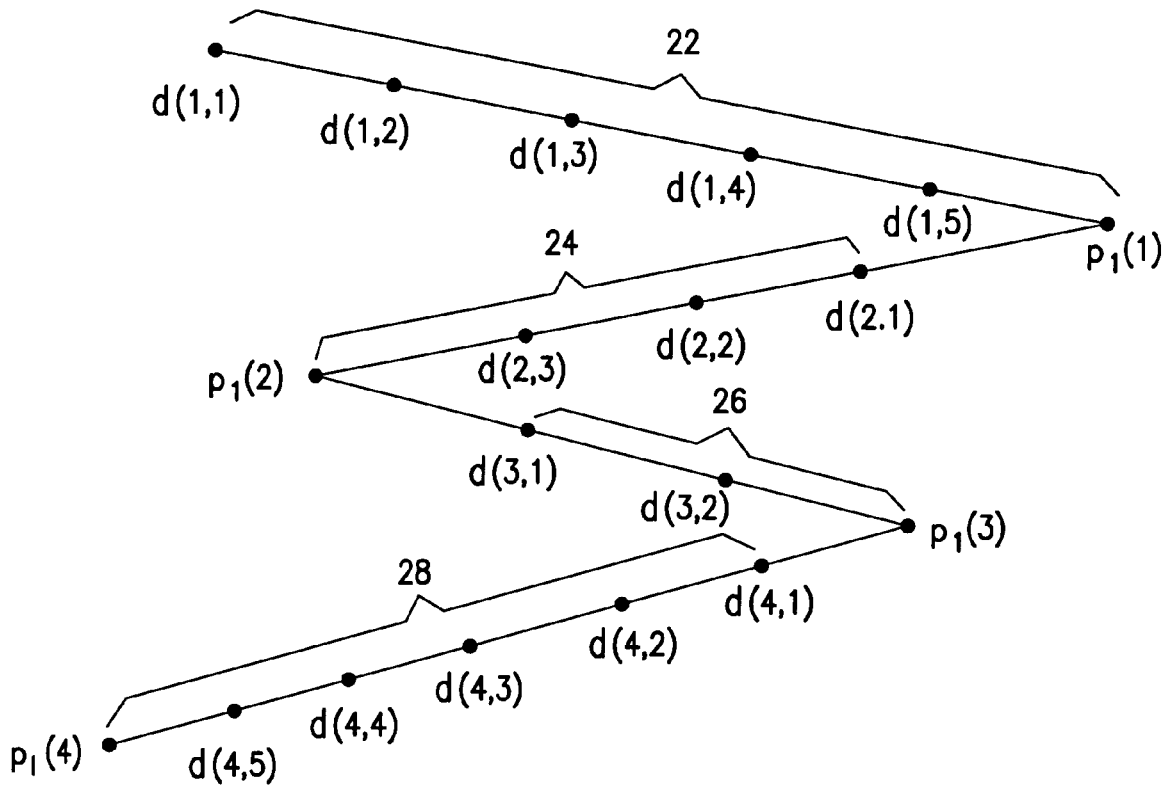
FIG. 3 is a schematic view of information bits and parity bits in a zigzag code according to the present invention.
FIG. 4A is a matrix of information bits of FIG. 3.
FIG. 4B is a first matrix of parity bits of FIG. 3.

As with FIG. 1, each straight line of FIG. 3 represents a code segment, with the exception of the parity bit that is included in the preceding code segment. This is a departure from the code segments defined in the paper by L. Ping et al., in that those code segments include all bits on a straight line. The Ping reference has at least one parity bit that is included in two code segments [e.g., p(2) of FIG. 1 and Ping]. Like the Ping paper, a code segment as used herein includes a string of at least one information bit and at least one parity bit, but for this description, each bit is included in one and only one code segment. Preferably, each code segment is a string of information bits terminated by a parity bit (or a group of K parity bits in sequence, where there are K constituent encoders). Alternatively, the parity bit of a string may be inserted anywhere, so long as the encoder and decoder are aware of the parity bit position. Information bits are represented as d(i,j), and parity bits are represented as $p_K(i)$. Each code segment is represented by a number $J_i$ of information bits where i=1, 2, 3, ... I. In the present zigzag code, the number of information bits in a code segment may vary from code segment to code segment among the I segments within a block or packet. Specifically, a first code segment 22 includes $J_i=J_1=5$ information bits, designated in FIG. 3 as d(1,1), d(1,2), d(1,3), d(1,4), and d(1,5), as well as the parity bit $p_1(1)$. The second code segment 24 includes $J_i=J_2=3$ information bits, designated as d(2,1), d(2,2), and d(3,3), and the parity bit $p_1(2)$. A third code segment 26 includes $J_i=J_3=2$ information bits, designated as d(3,1), and d(3,2), and the parity bit $p_1(3)$. A fourth code segment 28 includes $J_i=J_4=5$ information bits, designated as d(4,1), d(4,2), d(4,3), d(4,4), and d(4,5), and the parity bit $p_1(4)$. Other embodiments may include more than one parity bit in each code segment, and/or have parity bits dispersed among the information bits of that code segment. As an example of the former, where four constituent encoders are used, each $I^{th}$ code segment may include parity bits $p_2(i)$, $p_3(i)$, and $p_4(i)$. As an example of the latter, the parity bits $p_1(i)$ may be disposed as the second bit in each code segment rather than appended to a beginning or end of the $J_i$ information bits.

One fundamental difference is that the generalized zigzag code of the present invention can have a non-uniform number of information bits in each code segment, represented by $J_i$, i=1, 2, 3, ... I. The total number of information bits is then $$\sum_{i=1}^{I} J_i = B,$$

and the total number of transmitted bits will be $$\sum_{i=1}^{I} (J_i + K) = \sum_{i=1}^{I} J_i + I * K,$$

where K is the number of constituent encoders that each contribute one parity bit to each code segment. The rate of this generalized zigzag code will then be equal to $$\sum_{i=1}^{I} J_i \bigg/ \left( \sum_{i=1}^{I} J_i + I * K \right).$$

If $\bar{J}$ is defined as the average of the $J_i$ values over all of the I segments, i.e. if $$\bar{J} = \sum_{i=1}^{I} J_i / I = B / I,$$

then the code rate can be simplified to $\bar{J}/(\bar{J}+K)$. This expression is similar in form to the rate expression for a conventional concatenated zigzag code given above, but different in implementation in that the $\bar{J}$ parameter in this expression can take non-integer values as well, thus allowing for a larger set of available rates.

The concept is shown in tabular form at FIGS. 4A-4B for a non-concatenated code according to the present invention. Each of the code segments has a total number of $J_i$ information bits and one parity bit, and each code segment includes those information bits d(i,j) along one row of the matrix of FIG. 4A followed by the matching parity bit from the matrix of FIG. 4B. In the present invention, the code segments need not be of identical length, and in the example of FIGS. 4A-4B, the four code segments are of length six, (i=1 and 4), four (i=2), and three (i=3). The overall code is then the sequence of code segments arranged seriatim. Concatenating the code of FIGS. 4A-4B merely entails further adding parity bits to each code segment (e.g., adding additional columns to the matrix of FIG. 4B).

As a more practical example, consider designing a zigzag code of rate x=0.71875 with a block size (the number of information bits in a packet) B=3864. These parameters represent one of the rate and packet size combinations proposed for the 1×EV-DV standard. With these parameters, the number of transmitted bits will be equal to 5376 (0.71875=3864/5376), with a total of 1512 parity bits. Assuming further that the number of encoders K is four results in I=378 code segments. Using the above expression for the coding rate $\bar{J}/(\bar{J}+K)$ with K=4 yields an average code segment length of $\bar{J}=10.\overline{2}$. There are many different sets of $J_i$ parameters that result in the above $\bar{J}$. Below are three possible sets:

$$J_i = \begin{cases} 10 & \mod(i, 9) \neq 0 \\ 12 & \mod(i, 9) = 0 \end{cases}$$

$$J_i = \begin{cases} 9 & \mod(i, 9) \neq 0 \\ 20 & \mod(i, 9) = 0 \end{cases}$$

$$J_i = \begin{cases} 8 & \mod(i, 9) \neq 0 \\ 28 & \mod(i, 9) = 0 \end{cases}$$

Figure 7:
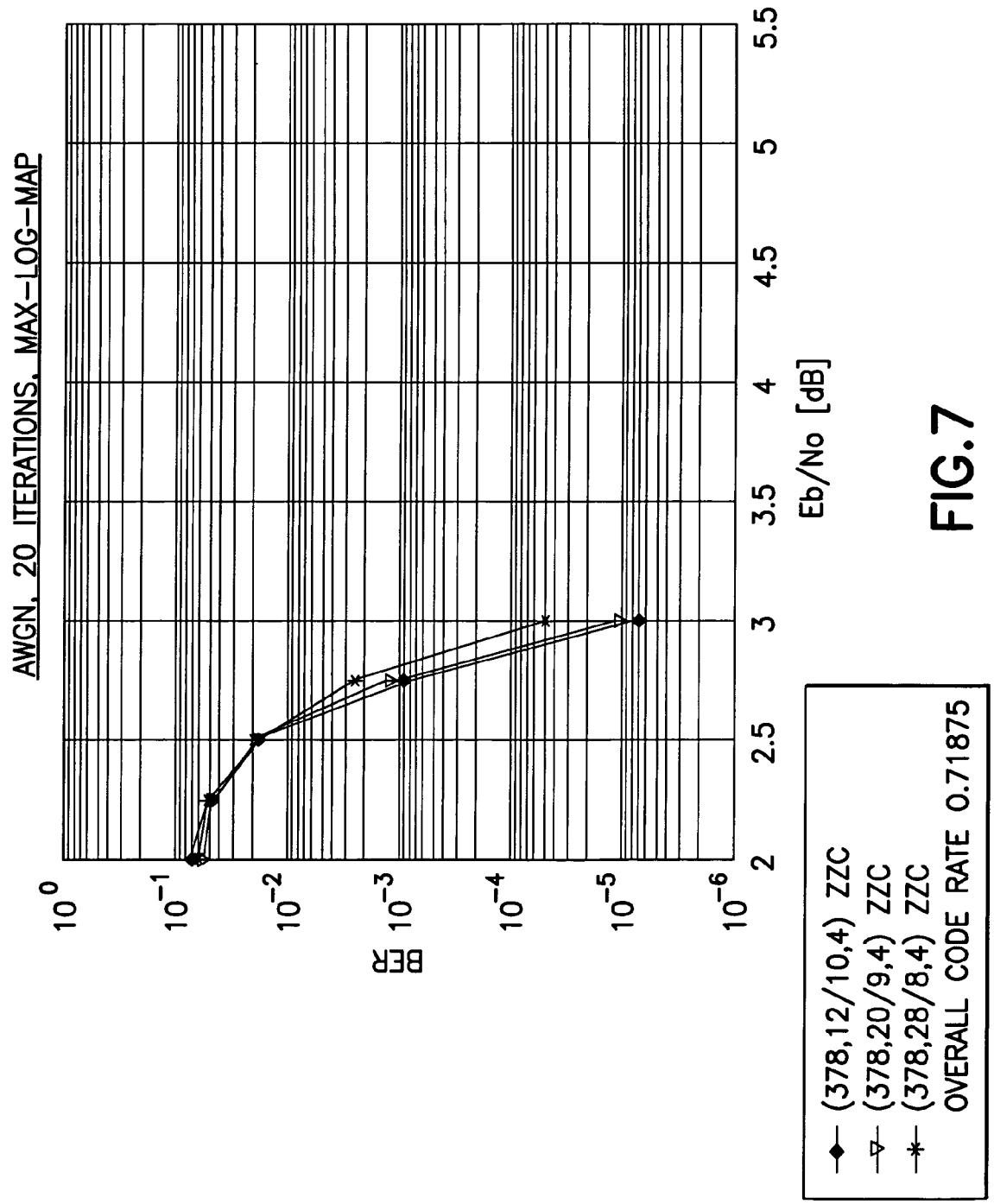
FIG. 7 is a graph of BER versus $E_b/N_0$ comparing performance of three zigzag codes according to the present invention, each having rate 0.71875 and block size of 3864, with BPSK modulation in an AWGN channel.

The performances of these three codes using BPSK modulation in an AWGN channel are compared in FIG. 7. The best performance is achieved by the first set of the $J_i$ parameters of the above listing. This is because in a generalized zigzag code (i.e., those of the present invention) with different $J_i$ values at different i segments, the contribution of longer segments to error events is greater than the contribution of the short segments. As the disparity between the longest and shortest $J_i$ values become larger, the performance becomes increasingly dominated by contribution of the long segments to the error events. Therefore, to achieve the best performance, the disparity between the longest and shortest segment length should be minimized, or the maximum length of $J_i$ for i=1, . . . , I should be minimized. While in the ideal (where J is an integer), this condition would result in the zigzag code described in the paper by L. Ping et al., in practice at least some segment lengths will need to vary from one another in order to achieve a coding rate commensurate with whatever wireless (or other) standard is operable at the time in a given telecommunication network. The above condition allows optimization within the practical confines of existing network infrastructure.

In light of the above description of generalized zigzag codes, punctured zigzag codes are now described. The generalized zigzag coding scheme described above enables concatenated zigzag codes of arbitrary rates. However, it cannot be directly used in a hybrid ARQ system with incremental redundancy. Furthermore, the encoder and decoder are very much dependent on the code rate, and the same hardware or software cannot generally be used to encode and decode codes at different rates. Code puncturing is a method that has been widely used to generate higher rate codes from a lower rate "mother" code. It enables the transmitter and receiver to use the same hardware or software to perform encoding and decoding at different rates. It also allows for ARQ with incremental redundancy. The paper by K. S. Chan et al., described above in the background section, describes a method of puncturing concatenated zigzag codes that can be used in hybrid ARQ systems. As the inventors understand the Chan proposal, first only the parity bits generated by the first encoder are transmitted. If the receiver was unable to decode the packet correctly, then the parity bits generated by the second encoder are transmitted. This iterative process continues until the receiver properly decodes the packet. Like the prior art zigzag codes of the paper by L. Ping et al., the approach of the paper by K. S. Chan et al. appears not to enable an arbitrary rate code, so the set of available coding rates is somewhat limited and does not appear compatible with certain coding rates of wireless standards, such as 1×EV-DV noted above. As with the paper by L. Ping et al., the only possible rates are J/(J+1), J/(J+2), . . . , J/(J+K), where each of J and K are integer values. Furthermore, the approach of K. S. Chan appears to require different encoders and decoders for the different possible coding rates. Following are described efficient puncturing methods for the generalized zigzag codes described above, puncturing methods that can provide complete flexibility in the code rate without requiring any change in the hardware or software of the encoder and decoder.

Two alternatives can be considered to generate punctured zigzag codes. According to a first puncturing approach, adjacent code segments are merged, and need to generate the parity bits that would otherwise lie at the juncture between them is avoided. In this approach, the intermediate punctured parity bit between the merged code segments is not generated at all in the transmitter. At the receiver, the merged long segment is used to decode the punctured code, without any need to substitute for the missing parity bit. This first puncturing approach can result in a concatenation of the prior art zigzag code, or a concatenation of the generalized zigzag code described above, depending on whether or not the parity bits are punctured uniformly and/or periodically across the whole code matrix.

In a second puncture approach, the original encoder (e.g., an encoder adapted to encode at the "mother" code rate) is used to encode the information bits and generate the parity bits. Following that, some of the parity bits are removed from the encoded bit stream to provide the desired rate. At the receiver, the punctured parity bits may be replaced with zeros (since the parity bits are used to confirm a total ones value) and the now de-punctured bit stream is passed through the decoder of the original mother code. The zero soft values at the punctured bit locations account for the lack of observations and the uncertainty about those bits.

Both puncturing approaches can provide any arbitrary rate higher than the rate of the original code. The puncturing pattern in either approach does not need to be uniform or periodic, and can be any arbitrary pattern. It can also be optimized to provide the best performance for a given rate. Following is shown that these two approaches are in fact mathematically equivalent.

For simplicity, consider a prior art zigzag code (I, J). Extension of the derivations below to the generalized zigzag codes and concatenated zigzag codes is straightforward. For further simplicity of explanation, only one parity bit is punctured. The equivalence of the two approaches in the case of puncturing more than one parity bit can be verified by applying the arguments below for each punctured parity bit.

Represent the parity bit to be punctured as the $i^{th}$ parity bit. To show the equivalence at the transmitter, it is sufficient to show that the value of p(i+1) for the two puncturing methods is identical. Since in the second approach, $$p(i) = \sum_{j=1}^{J} d(i,j) + p(i-1) \bmod 2,$$

then $$p(i+1) = \sum_{j=1}^{J} d(i+1, j) + p(i) \bmod 2$$
$$= \sum_{j=1}^{J} d(i+1, j) + \sum_{j=1}^{J} d(i, j) + p(i-1) \bmod 2$$

The latter expression from the second approach is the same for the parity bit p(i+1) as for the first method (with segments i and i+1 merged from Equation [1]).

The MLA of the parity and information bits in the $i^{th}$ and $(i+1)^{st}$ segments corresponding to the above two puncture approaches are derived below. This shows their equivalence at the receiver, and show that the two puncture approaches are identical. The following lemma will be used in these calculations.

Lemma 1: $W(W(a_1, \ldots, a_n), b_1, \ldots, b_m) = W(a_1, \ldots, a_n, b_1, \ldots, b_m)$.

Proof: Define $b_0 = W(a_1, \ldots, a_n)$. By definition of $$W(.), \text{ then } \mathrm{sgn}(b_0) = \prod_{i=1}^{n} \mathrm{sgn}(a_i)$$

and $$|b_0| = \min_{1 \le i \le n} |a_i|.$$

Therefore $$W\left(W\begin{pmatrix}(a_1, \ldots, a_n), \\ b_1, \ldots, b_m\end{pmatrix}\right) =$$

$$W(b_0, b_1, \ldots, b_m) = \left[\prod_{j=0}^{m} \operatorname{sgn}(b_j)\right] \min_{0 \le j \le m} |b_j| = \left[\operatorname{sgn}(b_0) \prod_{j=1}^{m} \operatorname{sgn}(b_j)\right]$$

$$\min\left\{|b_0|, \min_{1 \le j \le m} |b_j|\right\} = \left[\prod_{i=1}^{n} \operatorname{sgn}(a_i) \prod_{j=1}^{m} \operatorname{sgn}(b_j)\right] \min$$

$$\left\{\min_{1 \le i \le n} |a_i|, \min_{1 \le j \le m} |b_j|\right\} = W(a_1, \ldots, a_n, b_1, \ldots, b_m)$$

To show equivalence of the two puncture approaches at the receiver, it is sufficient to show that F[p(i+1)], B[p(i−1)], L[d(i,1)], . . . , L[d(i,J)], and L[d(i+1,1)], . . . , L[d(i+1,J)] are equal for the two approaches. In the second approach where all parity bits are generated at the transmitter and the punctured bits are replaced by zeros at the receiver, the receiver will assume that $\tilde{p}(i)=0$. Therefore, the respective forward and backward MLA for the parity bit are:

$$F[p(i)] = W(F[p(i-1)], \tilde{d}(i,1), \ldots, \tilde{d}(i,J)) \qquad [5]$$

and $$B[p(i)] = W(\tilde{d}(i+1,1), \ldots, \tilde{d}(i+1,J), B[p(i+1)]). \qquad [6]$$

Using equation [5] and Lemma 1 yields:

$$F[p(i+1)] = \tilde{p}(i+1) + W(F[p(i)], \tilde{d}(i+1,1), \ldots, \tilde{d}(i+1,J)) = \qquad [7]$$

$$\tilde{p}(i+1) + W(W(F[p(i-1)], \tilde{d}(i,1), \ldots, \tilde{d}(i,J)), \tilde{d}(i+1,1),$$

$$\ldots, \tilde{d}(i+1,J)) = \tilde{p}(i+1) + W(F[p(i-1)],$$

$$\tilde{d}(i,1), \ldots, \tilde{d}(i,J), \tilde{d}(i+1,1), \ldots, \tilde{d}(i+1,J)),$$

Equation [7] is exactly the same expression for F[p(i+1)] as that in the first approach (with segments i and i+1 merged).

Similarly, for the backward MLA of p(i−1), equation [6] and Lemma 1 yield:

$$B[p(i-1)] = \tilde{p}(i-1) + W(\tilde{d}(i,1), \ldots, \tilde{d}(i,J), B[p(i)]) = \qquad [8]$$

$$\tilde{p}(i-1) + W(\tilde{d}(i,1), \ldots, \tilde{d}(i,J),$$

$$W(\tilde{d}(i+1,1), \ldots, \tilde{d}(i+1,J), B[p(i+1)])) =$$

$$\tilde{p}(i-1) + W(\tilde{d}(i,1), \ldots, \tilde{d}(i,J), \tilde{d}(i+1,1), \ldots,$$

$$\tilde{d}(i+1,J), B[p(i+1)]),$$

Equation [8] is exactly the same expression for B[p(i−1)] as that in the first approach (with segments i and i+1 merged).

Now, calculate the MLA, L[d(i,1)], . . . , L[d(i,J)], L[d(i+1,1)], . . . , L[d(i+1,J)], for the second approach, using equation [6] and Lemma 1 for j=1, 2, 3, . . . J.

$$L[d(i,j)] = \qquad [9]$$

$$\tilde{d}(i,j) + W(F[p(i-1)], \tilde{d}(i,1), \ldots, \tilde{d}(i,j-1), \tilde{d}(i,j+1),$$

$$\ldots, \tilde{d}(i,J), B[p(i)]) =$$

$$\tilde{d}(i,j) + W(F[p(i-1)], \tilde{d}(i,1), \ldots, \tilde{d}(i,j-1), \tilde{d}(i,j+1), \ldots,$$

$$\tilde{d}(i,J), W(\tilde{d}(i+1,1), \ldots, \tilde{d}(i+1,J), B[p(i+1)])) =$$

$$\tilde{d}(i,j) + W(F[p(i-1)], \tilde{d}(i,1), \ldots, \tilde{d}(i,j-1),$$

$$\tilde{d}(i,j+1), \ldots, \tilde{d}(i,J), \tilde{d}(i+1,1),$$

$$\ldots, \tilde{d}(i+1,J), B[p(i+1)]),$$

Equation [10] is exactly the same expression for L[d(i,j)] as that in the first approach (with segments i and i+1 merged).

Similarly for j=1, . . . , J, and using equation [5] and Lemma 1:

$$L[d(i+1,j)] = \qquad [10]$$

$$\tilde{d}(i+1,j) + W(F[p(i)], \tilde{d}(i+1,1), \ldots, \tilde{d}(i+1,j-1),$$

$$\tilde{d}(i+1,j+1), \ldots, \tilde{d}(i+1,J), B[p(i+1)]) =$$

$$\tilde{d}(i+1,j) + W(W(F[p(i-1)], \tilde{d}(i,1), \ldots, \tilde{d}(i,J)),$$

$$\tilde{d}(i+1,1), \ldots, \tilde{d}(i+1,j-1),$$

$$\tilde{d}(i+1,j+1), \ldots, \tilde{d}(i+1,J), B[p(i+1)]) =$$

$$\tilde{d}(i+1,j) + W(F[p(i-1)], \tilde{d}(i,1), \ldots, \tilde{d}(i,J),$$

$$\tilde{d}(i+1,1), \ldots, \tilde{d}(i+1,j-1),$$

$$\tilde{d}(i+1,j+1), \ldots, \tilde{d}(i+1,J), B[p(i+1)]),$$

Equation [10] is exactly the same expression for L[d(i+1,j)] as that in the first approach (with segments i and i+1 merged).

Since the MLA's of other parity and information bits are not affected by the merging or puncturing in the two approaches, all of the MLA's in the two approaches must be equal, and thus the two approaches are equivalent at the receiver (though implemented differently). Since it has been shown above that they are also equivalent at the transmitter, the two merging and puncturing approaches described above are equivalent. The advantage of the second approach is that it uses the same encoder and decoder as that used with the original (i.e., "mother") code, thus minimizing the required changes in the hardware and software implementation.

As an example, assume a rate 1/2 zigzag code defined by (I, J, K)=(1120,4,4) as mother code (for this example, $J_i$=J for all code segments). This means that for every 4 information bits this code will generate 4 parity bits in each of the code segments (one parity bit from each of the four encoders). The total number of information bits is B=I*$J_i$=1120*4=4480. The total number of parity bits is also 4480 as this is a rate 1/2 code, and the total number of transmitted bits in the packet is 8960. Now consider puncturing parity bits to achieve a rate 5/6 code from this same encoder. Transmitted with the 4480 information bits will then be only 896 parity bits to achieve the higher code rate, leaving the remaining 3584 parity bits to be punctured. This means that 4 out of every 5 parity bits (of the original 1/2 rate code) must be punctured. It is advantageous to have at least one parity bit from each of the four encoders remaining in the final code word that is transmitted. As there are 4 encoders in the mother code, 16 out of every 20 parity bits (of the original 1/2 rate code) will need to punctured in order to generate a rate 5/6 code.

Figure 8:
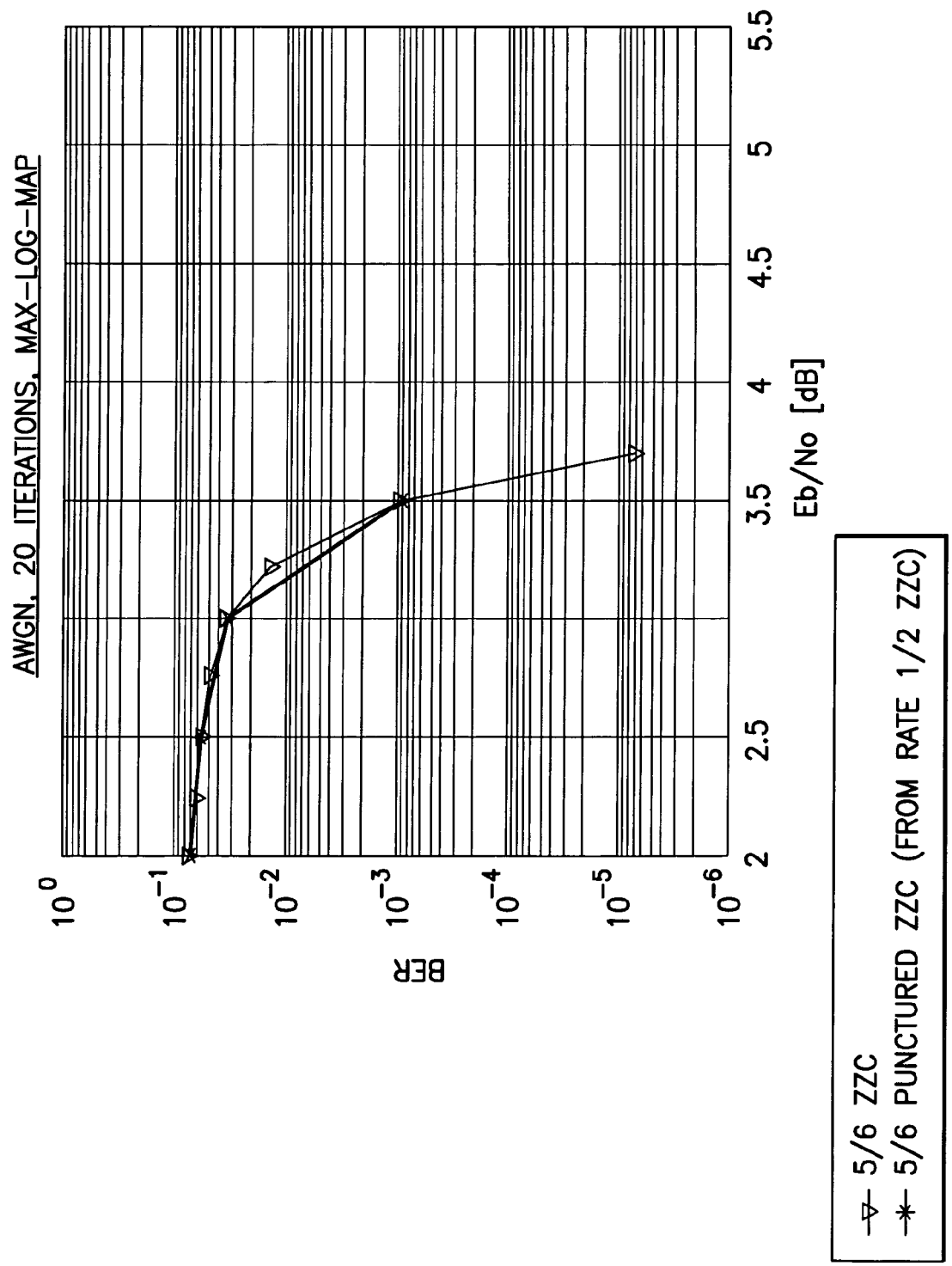
FIG. 8 is a graph of BER versus $E_b/N_0$ comparing performance of a full zigzag code [(224,20,4) code rate=5/6] and a punctured zigzag code [from rate 1/2(1120,4,4) zigzag code, effective code rate=5/6] in AWGN channel, with BPSK modulation and interleaver size 4480.

As detailed above, this can be done in two ways. In the first approach, 16 out of every 20 parity bits are removed (or never generated), and the corresponding segments are merged. This results in a (224,20,4) concatenated zigzag code. Note that I=224=1120/5 and J=20=4*5. In the second approach, the original (1120,4,4) code is used to generate all of the parity bits, but only 4 out of every 20 parity bits are transmitted. At the receiver, zeros are substituted in the locations of the missing parity bits, and the resulting soft bit stream is passed through the decoder of the original rate 1/2 code. FIG. 8 compares the performances of these two methods in AWGN channel. As expected, these two approaches have the identical performance at all of the simulated SNR values. Note that while the graphed lines do diverge in one area, each and every actual data point is identical.

By allowing for different lengths for different segments, the generalized zigzag codes can provide arbitrary code rates as required by many practical wireless standards. Two different approaches for generating punctured zigzag codes have been detailed, and it has been shown above that both approaches result in the same performance. The proposed puncturing approaches can be applied to the prior art concatenated zigzag codes as well as the generalized zigzag codes presented herein. The advantage of using punctured zigzag codes is that in addition to providing the flexibility in the code rate, they do not require any change in the hardware or software of the original encoder and decoder.

An example of how decoding operates by inserting null parity bits (zeros by convention) follows. Assume a decoder rate is $x_{decode}$, and the encoder encodes B information bits and $P_{encode}$ parity bits at a rate $$x_{encode} = \frac{B}{B + P_{encode}}.$$

For this example, the encoding rate is higher than the rate of the decoder, which must be so if the decoder is to insert the punctured bits. The total number of parity bits needed in the block, in order for the decoder to decode at its rate, is then $$P_{decode} = B\left(\frac{x_{encode}}{x_{decode}} - 1\right) + \frac{x_{encode}}{x_{decode}} P_{encode}.$$

The difference between the number of parity bits needed at the decoder and the number of actual parity bits in a received block is $P_{diff} = P_{decode} - P_{encode}$, which represents the number of null parity bits to be inserted in the block at the receiver. For the zigzag code, it is preferred that these null parity bits be added at the locations from which they were originally punctured (whether or not actually generated at the transmitter). There are I=$P_{encode}$ code segments in the received block, but the addition of the $P_{diff}$ parity bits will yield a total of $P_{decode}$ code segments once the null parity bits are added at the decoder. For each of the I=$P_{encode}$ code segments in the received block, the decoder inserts a number $$\frac{P_{decode}}{P_{encode}} - 1$$

of null parity bits. Thus each code segment of the received block is broken up into a total of $P_{decode}$ code segments after the null parity bits are added. The above example using a rate 5/6 code of B=4480 information bits and $P_{encode}$=896 parity bits finds the decoder adding four null parity bits to each of I=$P_{encode}$=896 received code segments, segmenting them into a total of 4480 code segments after addition of the $P_{diff}$=3584 null parity bits to achieve a rate 1/2 code for the decoder.

Figure 5:
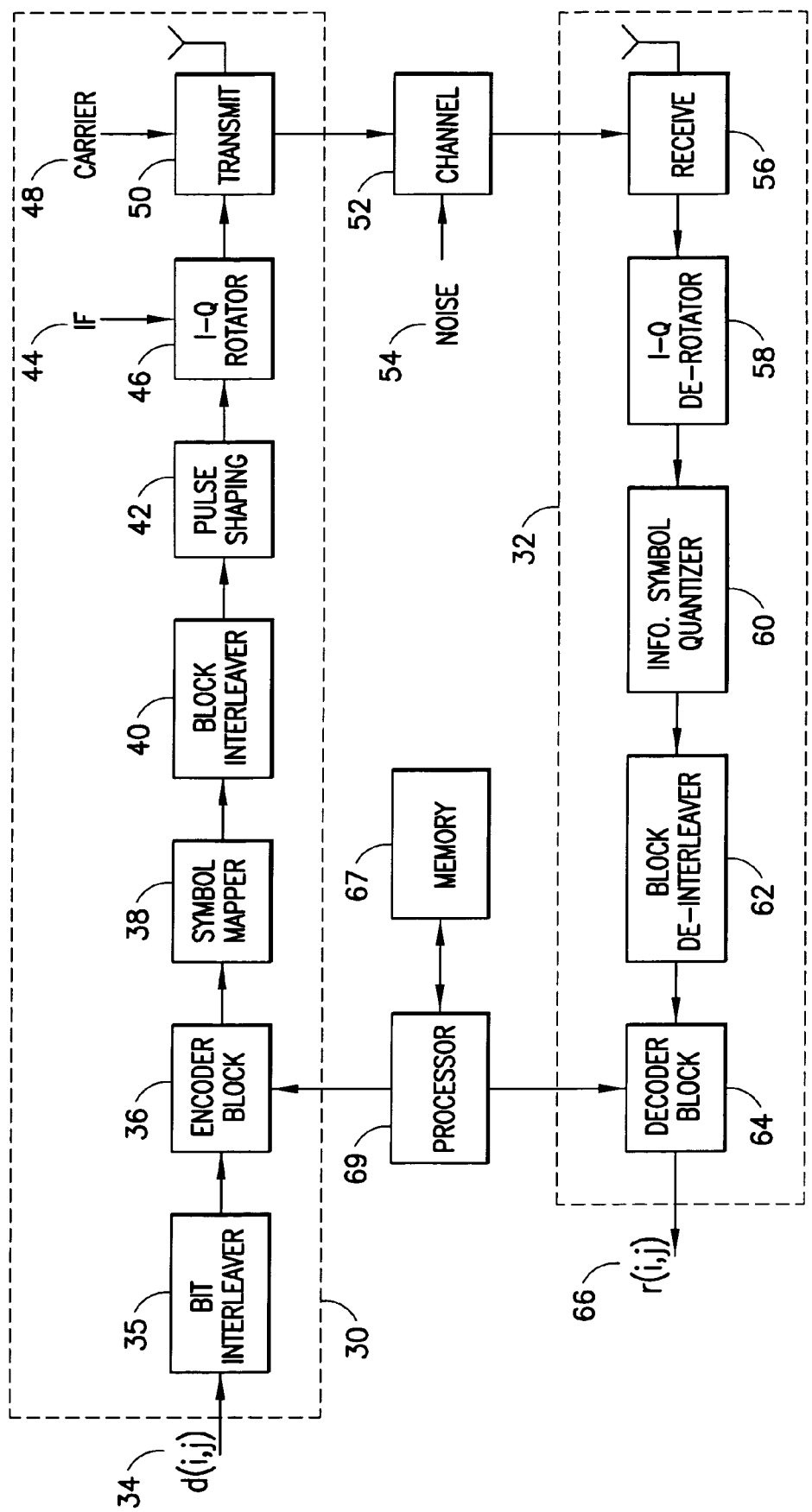
FIG. 5 is a block diagram of a transceiver that operates using the codes of the present invention.

Following is an exemplary description of a transceiver that may operate using the generalized zigzag codes, and with punctured zigzag codes of either the generalized variety or the specific case of each code segment being of equal length. The transceiver of FIG. 5 is schematically divided into transmitter 30 and receiver 32, but it is understood that in a physical transceiver, certain of the illustrated functional blocks may be combined into a single physical element. Where separate, each of the transmitter 30 and receiver 32 include a memory 67 and processor 69, though only one of each is depicted in FIG. 5. The present invention may be embodied in a transmitter 30, a receiver 32, or a transmitter/receiver having different functional blocks from those shown in FIG. 6, such as an OFDM transmitter/receiver. The generalized form of the receiver as shown is not limiting to the present invention, as the inventive code is accomplished in the encoder block 36. In the transmitter of FIG. 5, a block of information bits d(i,j) 34 is input into a bit interleaver 35 whose output feeds into an encoder block 36. Within the encoder block 36 may be one or more encoders that calculate and insert parity bits into the stream of information bits, and that puncture the parity bits as described above. The output of the encoder block is the zigzag code, which is a series of code segments of information bits d(i,j) 34 terminating in a parity bit p(i). This zigzag code may be concatenated and/or punctured, as detailed above. The total number of information bits d(i,j) 34 in the block is determined by the code rate and the operable transmission standard in use by the transmitter, as detailed above by example (e.g., a particular block size and coding rate for 1xEV-DV). The individual bits of the zigzag code are converted at a symbol mapper 38, which correlates groups of bits to points of a space-time signal constellation. [That the information and parity bits are mapped to symbols, so that symbols rather than bits are transmitted and received, does not negate that the bits are transmitted and received: for this description at least, the conversion between bits and symbols is merely a translation that does not alter the underlying information except in form.] Strings of symbols may then be interleaved at a block interleaver 40. The output of the block interleaver 40 may be shaped at a pulse shaping filter 42 that breaks up burst errors extending longer than one symbol interval, and then split into in-phase I and quadrature Q components and upconverted to an intermediate frequency 44 at a phase rotator 46. Pilototones (not shown) may be added at this juncture to facilitate channel identification at the receiver side 32. The rotated signal is modulated onto a carrier wave 48 and transmitted 50 via one or more transmit antennas over at least one communication channel 52, where it picks up noise 54.

At the receiver 32, the signal is received 52 at one or more receive antennas, and de-rotated 58. Information symbols (which represent a combination of the information bits and the parity bits) are quantized 60 (e.g., sampled and decimated) and processed into the block de-interleaver 62. In a decoder 64, the de-interleaved symbols are decoded into information and parity bits and the parity bits. A series of decoded bits r(i,j) 66 that preferably differ from the original information bits d(i,j) by no more than the maximum allowable BER, are output for further processing, which depends on whether the packet is voice or data. It is understood that additional processing may be employed at various points of the above generalized transmitter 30 and receiver 32.

Encoding of the information bits d(i,j) 34 within the encoder block 36 of FIG. 5 is further detailed in FIG. 6 and the description below, which assumes that there are K=4 constituent encoders within the encoder block 36. Assume further, as above, that the coding rate is x=0.71875, and there are B=3864 information bits in the block. As above, the number of parity bits are calculated as $$K*I = \frac{B}{x} - B,$$

so there are a total of 1512 parity bits and I=378 code segments. Whether or not puncturing is used is reflected in the coding rate and block size; puncturing is used to increase coding rate. The average code segment length is then calculated as $$\overline{J} = \frac{B}{I}.$$

A set of $J_i$ is selected such that $$\sum_{i=1}^{I} J_i = B = \overline{J}I$$

for i=1, 2, . . . I, where I=378 is calculated as above. Using the assumptions above yields $\overline{J}=10.\overline{2}$ and $J_i$ may be selected as $$J_i = \begin{cases} 10 & \mod(i, 9) \neq 0 \\ 12 & \mod(i, 9) = 0 \end{cases}.$$

It is noted that the above calculations are generally not done within the transmitter or receiver themselves, but the results are generally provided to the transceiver and stored in the memory 67 (FIG. 5) alongside the coding rate and block size for use when that coding rate/block size combination is used. The processor 69 (FIG. 5) then directs the encoder to operate using the parameters (I, $J_i$) for a given coding rate x and block size B. Similar data is stored in the receiver. In this manner, both the transmitter and receiver operate using the same set of $J_i$.

Assume that each of the four constituent encoders 70*a-d* generates the parity bit $p_K(i)$ for each of the I code segments. Assume further that code segments for which the index i is an even number (of the examples given) have $J_{i=even}$=12, and that code segments for which i is an odd number (of the examples given) have $J_{i=odd}$=10. From the set of $J_i$ above, not all code segments have either 10 or 12 information bits, but those values are used for i=1, 2, . . . 8 below for simplicity of explanation. The overall string of information bits d(i,j) 34 that will make up a block of size J=3864 are input into the encoder block 36. The results are as follows for the first eight code segments:

| Index i | # of info. bits | Members of $i^{th}$ code segment (CS) | CS length |
|---|---|---|---|
| i = 1 | $J_1$ = 10 | d(1, 1), d(1, 2), . . . d(1, 10), $p_1(1), p_2(1), p_3(1), p_4(1)$ | 14 |
| i = 2 | $J_2$ = 12 | d(2, 1), d(2, 2), . . . d(2, 12), $p_1(2), p_2(2), p_3(2), p_4(2)$ | 16 |
| i = 3 | $J_3$ = 10 | d(3, 1), d(3, 2), . . . d(3, 10), $p_1(3), p_2(3), p_3(3), p_4(3)$ | 14 |
| i = 4 | $J_4$ = 12 | d(4, 1), d(4, 2), . . . d(4, 12), $p_1(4), p_2(4), p_3(4), p_4(4)$ | 16 |
| i = 5 | $J_5$ = 10 | d(5, 1), d(5, 2), . . . d(5, 10), $p_1(5), p_2(5), p_3(5), p_4(5)$ | 14 |
| i = 6 | $J_6$ = 12 | d(6, 1), d(6, 2), . . . d(6, 12), $p_1(6), p_2(6), p_3(6), p_4(6)$ | 16 |
| i = 7 | $J_7$ = 10 | d(7, 1), d(7, 2), . . . d(7, 10), $p_1(7), p_2(7), p_3(7), p_4(7)$ | 14 |
| i = 8 | $J_8$ = 12 | d(8, 1), d(8, 2), . . . d(8, 12), $p_1(8), p_2(8), p_3(8), p_4(8)$ | 16 |

Figure 6:
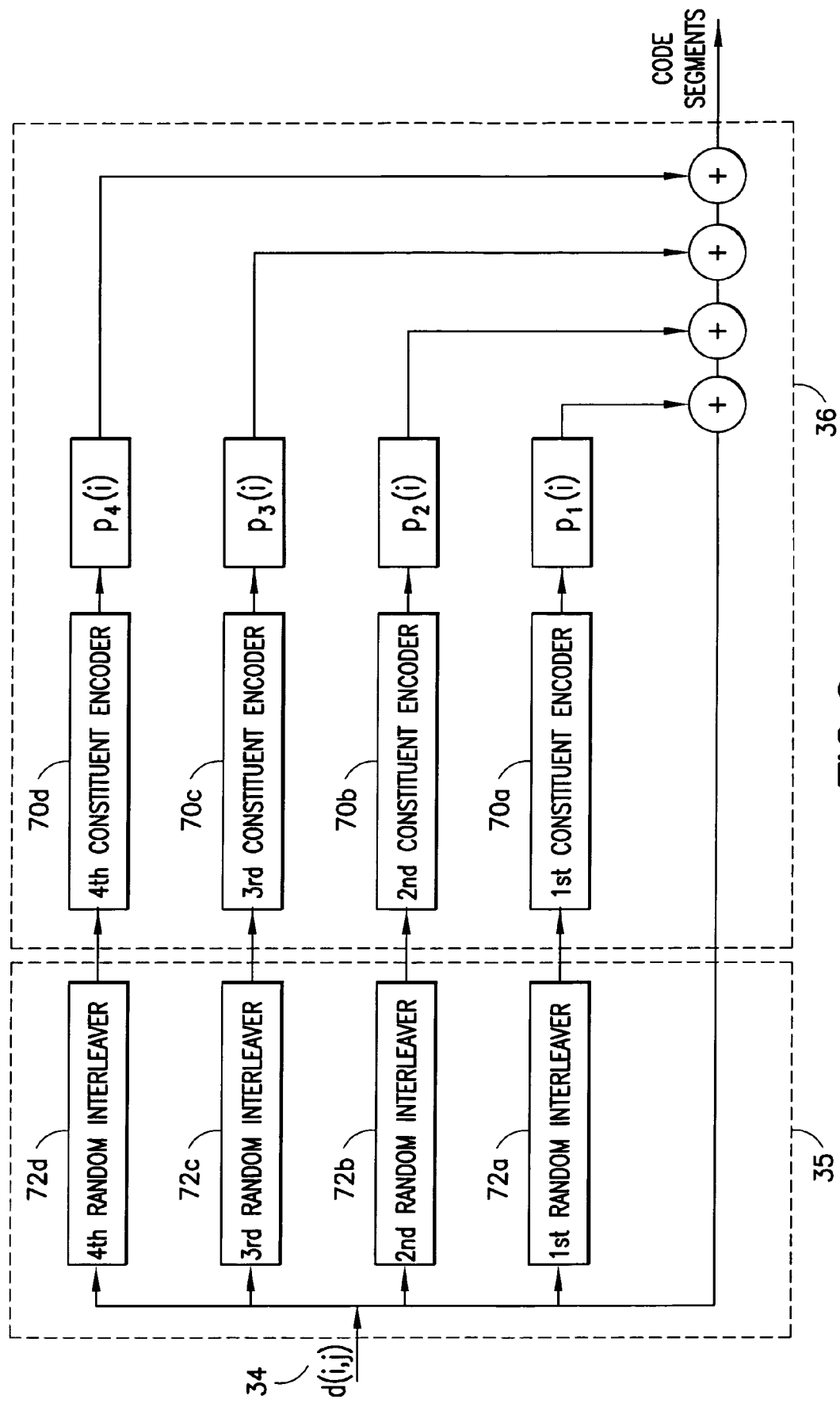
FIG. 6 is a diagram showing details of the bit interleaver and encoder blocks of FIG. 5.

In FIG. 6, the stream of information bits 34 is input into the bit interleaver block 35, which includes four (in this example) random interleavers 72*a-d* in parallel. Each of the random interleavers 72*a-d* interleaves the information bits 34 differently, and provides an output that is particular to its own interleaving. Each of these different outputs is fed into one of four (in this example) constituent encoders 70*a-d* of the encoder block 36, which generate their respective parity bits $p_1(i)$, $p_2(i)$, $p_3(i)$, or $p_4(i)$ that give parity to their respective constituent encoder input. The parity bit output from each constituent encoder 70*a-d* is then added, for every i=1, 2, . . . I, to the $J_i$ group of information bits from the original stream of information bits d(i,j) 34 (i.e., the un-interleaved stream), dividing the stream of information bits 34 into the code segments, which are output seriatim from the encoder block 36. The adders shown within the encoder block 36 of FIG. 6 are not to be construed as an arithmetic combination of bits, but merely the insertion of the parity bits output from the constituent encoders within the original bit stream of information bits 34. Where the bit stream of information bits 34 is represented by the matrix such as that of FIG. 4A, each constituent encoder adds a column of parity bits such as that of FIG. 4B. The output of FIG. 6, given the conditions above, is shown in the above table: for the 88 noted information bits d(i,j) 34 shown for the block, there is one parity bit $p_K(i)$ added by each of the K=4 constituent encoders 70*a-d* to each of the eight tabulated code segments, yielding a total of 120 bits in code segments of length either 14 or 16 bits.

Where the code is punctured, the puncturing is reflected in the calculation of I given the coding rate x and block size B as detailed above. Thus, it is irrelevant in the resulting code whether the punctured parity bits are generated and decimated, or never generated at all. The stream of coded bits (which is the sequential arrangement of code segments, each having information and parity bits) are then mapped to a signal constellation, filtered, modulated and upconverted, and transmitted as in known in the art. The present invention is particularly well adapted for use in a mobile station, such as a mobile telephone, a PDA with two way communication capability, a Blackberry® device, a walkie talkie, and the like. In the receiver, a decoder operates similarly, though it may do so with or without a plurality of constituent decoders.

While there has been illustrated and described what is at present considered to be preferred and alternative embodiments of the claimed invention, it will be appreciated that numerous changes and modifications are likely to occur to those skilled in the art. It is intended in the appended claims to cover all those changes and modifications that fall within the spirit and scope of the claimed invention.

What is claimed is:

1. A method for encoding a stream of information bits, comprising:
   determining a coding rate x and a number of information bits B to be encoded in a packet, where B is an integer and x is a real number;
   providing a number K of encoders to be used for encoding, wherein K is a non-zero integer;
   determining a number of parity bits $$K*I = \frac{B}{x} - B,$$

and a number of code segments I;
   selecting a set of values for $J_i$, where i=1, 2, ... I, such that $$\sum_{i=1}^{I} J_i = B,$$

wherein at least one value for $J_i$ differs from at least one other value for $J_i$ within the set;
   building a code segment by adding a parity bit from each of the K encoders to each $i^{th}$ set of $J_i$ information bits for all i=1,2, ... I; and
   outputting the I code segments sequentially.

2. The method of claim 1 wherein K=1.

3. The method of claim 1 wherein K is greater than one, and for each of the i code segments, the parity bits are appended to one of a beginning and an end of the $J_i$ information bits.

4. A method for encoding a stream of information bits, comprising:
   determining a coding rate x and a number of information bits J to be encoded in a packet, where J is an integer and x is a real number;
   providing a number K of encoders to be used for encoding, wherein K is a non-zero integer;
   determining a number of parity bits $$K*I = \frac{B}{x} - B,$$

and a number of code segments I;
   selecting a set of values for $J_i$, where i=1, 2, ... I, such that $$\sum_{i=1}^{I} J_i = B;$$

building a code segment by appending a parity bit to each string of $J_i$ information bits for all i=1,2, ... I; and
   outputting the I code segments sequentially,
   wherein the coding rate x is other than $$\frac{\overline{J}}{\overline{J}+1}, \frac{\overline{J}}{\overline{J}+2}, \ldots \frac{\overline{J}}{\overline{J}+K},$$

where $$\overline{J} = \frac{B}{I}.$$

5. The method of claim 4, wherein each value $J_i$ is identical to each other value $J_i$.

6. A method for decoding a stream of information bits, comprising:
   determining a coding rate x, a number of information bits B to be decoded from a packet, and a number K of constituent encoders used in encoding, where B and K are integers and x is a real number;
   determining a number of parity bits $$K*I = \frac{B}{x} - B,$$

and a number of code segments I;
   selecting a set of values for $J_i$, where i=1, 2, ... I, such that $$\sum_{i=1}^{I} J_i = B,$$

wherein at least one value for $J_i$ differs from at least one other value for $J_i$ within the set;
   for each $i^{th}$ code segment having $J_i$ information bits and K associated parity bits, checking the $J_i$ information bits against one of the associated parity bits for parity; and
   removing from the $i^{th}$ code segment the associated parity bit that was checked.

7. A method for decoding a stream of information bits, comprising:
   determining a coding rate x, a number of information bits B to be decoded from a packet, and a number K of constituent encoders used in encoding, where B and K are integers and x is a real number and $$x \neq \frac{\overline{J}}{J+1}, \frac{\overline{J}}{J+2}, \ldots \frac{\overline{J}}{J+K},$$

where $$\overline{J} = \frac{B}{I};$$

determining a number of parity bits $$K*I = \frac{B}{x} - B,$$

and a number of code segments I;

selecting a set of values for $J_i$, where i=1, 2, . . . I, such that $$\sum_{i=1}^{I} J_i = B;$$

and for each $i^{th}$ group of $J_i$ received information bits, checking parity among the $J_i$ information bits and at least one parity bit associated with the $J_i$ information bits, and removing the at least one parity bit that was used in the checking.

8. The method of claim 7, wherein each value $J_i$ is identical to each other value $J_i$.

9. A method for decoding a received block of data using a decoder of rate $x_{decode}$, said received block of data having B information bits and $P_{encode}$ parity bits encoded at a rate $$x_{encode} = \frac{B}{B + P_{encode}}$$

that differs from $x_{decode}$, the method comprising:

determining a total number of parity bits $P_{decode}$ for decoding such that $$P_{decode} = B\left(\frac{x_{encode}}{x_{decode}} - 1\right) + \frac{x_{encode}}{x_{decode}} P_{encode};$$

add a number $P_{diff} = P_{decode} - P_{encode}$ of null parity bits to the received block of data; and decode the received block of data with the added null parity bits in a rate $x_{decode}$ decoder.

10. The method of claim 9, wherein add a number $P_{diff} = P_{decode} - P_{encode}$ of null parity bits to the received block of data comprises:

for each of $P_{encode}$ code segments of the received block, insert a number $$\frac{P_{decode}}{P_{encode}} - 1$$

of null parity bits.

11. A transmitter comprising:

K constituent encoders, wherein K is a non-zero integer;

a memory for storing a block size value B of information bits in a block, a coding rate x associated with the block size value B, a total number K*I of parity bits $$K*I = \frac{B}{x} - B,$$

and a set of segment lengths $J_i$ such that $$\sum_{i=1}^{I} J_i = B \text{ for } i = 1, 2, \ldots I,$$

wherein each segment length $J_i$ is not identical;

a processor coupled to the memory and the K constituent encoders for causing each of the constituent encoders to insert a parity bit to each $i^{th}$ set of length $J_i$ of information bits for all i=1, 2, 3 . . . I segments to achieve the coding rate x for a block of B information bits; and a transmit antenna having an input coupled to an output of the encoder.

12. The transmitter of claim 11 wherein K=1.

13. The transmitter of claim 11 wherein K is greater than one, and each $K^{th}$ constituent encoder inserts a parity bit between sequential segments of $J_i$ information bits.

14. The transmitter of claim 11 disposed within a mobile station.

15. A transmitter comprising:

K constituent encoders, wherein K is a non-zero integer;

a memory for storing a block size value B of information bits in a block, a coding rate x associated with the block size value B, where $$x \neq \frac{\overline{J}}{J+1},$$

$$\frac{\overline{J}}{J+2}, \ldots \frac{\overline{J}}{J+K},$$

where $$\overline{J} = \frac{B}{I},$$

a total number K*I of parity bits $$K*I = \frac{B}{x} - B,$$

and a set of I segment lengths $J_i$ such that $$\sum_{i=1}^{I} J_i = B$$

for i=1, 2, . . . I;

a processor coupled to the memory and the K constituent encoders for causing each of the constituent encoder to insert a parity bit to each $i^{th}$ set of length $J_i$ of information bits for all i=1, 2, 3 . . . I segments to achieve the coding rate x for a block of B information bits; and a transmit antenna having an input coupled to an output of the encoder.

16. The transmitter of claim 15, wherein each segment length $J_i$ is identical to each other segment length $J_i$.

17. A receiver comprising:

a receive antenna having an output for receiving a packet;

a decoder having an input coupled to the output of the receive antenna;

a memory for storing a block size value B of information bits in a block, a coding rate x associated with the block size value B, a value K of encoders used in encoding a block size value B with a coding rate x, a total number K*I of parity bits $$K*I = \frac{B}{x} - B,$$

and a set of I segment lengths $J_i$ such that $$\sum_{i=1}^{I} J_i = B \text{ for } i = 1, 2, \ldots I,$$

wherein each segment length $J_i$ is not identical; and a processor coupled to the memory and the decoder for causing the decoder to delete a parity bit from each $i^{th}$ set of $J_i$ received information bits for all i=1, 2, 3 . . . I segments.

18. The receiver of claim 17, wherein the processor further causes the decoder, for each $i^{th}$ set of $J_i$ received information bits, to check parity of the $J_i$ bits using a parity bit associated with the $J_i$ information bits, for all i=1,2, . . . I.

19. The receiver of claim 17 disposed within a mobile station.

20. The receiver of claim 17, wherein the decoder is of rate $x_{decode}$ and the said coding rate is $$x_{encode} = \frac{B}{B + P_{encode}},$$

wherein the memory further is for storing a value $P_{encode}$ that represents a number of parity bits in a block that is encoded at rate $x_{encode}$ and a value $$P_{decode} = B\left(\frac{x_{encode}}{x_{decode}} - 1\right) + \frac{x_{encode}}{x_{decode}} P_{encode},$$

and wherein the decoder is for inserting a number $$\frac{P_{decode}}{P_{encode}} - 1$$

of null parity bits to each of the i code segments.

21. A receiver comprising:

a receive antenna having an output for receiving a packet;

a decoder having an input coupled to the output of the receive antenna;

a memory for storing a block size value B of information bits in a block, a coding rate x associated with the block size value B, where $$x \neq \frac{\overline{J}}{\overline{J}+1}, \frac{\overline{J}}{\overline{J}+2}, \ldots \frac{\overline{J}}{\overline{J}+K}, \text{ where } \overline{J} = \frac{B}{I},$$

a value K of encoders used in encoding a block size value B with a coding rate x, a total number K*I of parity bits $$K*I = \frac{B}{x} - B,$$

and a set of segment lengths $J_i$ such that $$\sum_{i=1}^{I} J_i = B \text{ for } i = 1, 2, \ldots I;$$

and a processor coupled to the memory and the decoder for causing the decoder to delete a parity bit from each $i^{th}$ set of $J_i$ received information bits for all i=1, 2, 3 . . . I segments.

22. The receiver of claim 21, wherein each segment length $J_i$ is identical to each other segment length $J_i$.

23. The receiver of claim 21, wherein the decoder is of rate $x_{decode}$ and the said coding rate is $$x_{encode} = \frac{B}{B + P_{encode}},$$

wherein the memory further is for storing a value $P_{encode}$ that represents a number of parity bits in a block that is encoded at rate $x_{encode}$ and a value $$P_{decode} = B\left(\frac{x_{encode}}{x_{decode}} - 1\right) + \frac{x_{encode}}{x_{decode}} P_{encode},$$

and wherein the decoder is for inserting a number $$\frac{P_{decode}}{P_{encode}} - 1$$

of null parity bits to each of the i code segments.

\* \* \* \* \*